United States Patent [19]

Kinoshita

[11] Patent Number: 5,278,406

[45] Date of Patent: Jan. 11, 1994

[54] APPARATUS FOR DETECTING INFORMATION CONTAINED IN ELECTRONS EMITTED FROM SAMPLE SURFACE

[75] Inventor: Katsuyuki Kinoshita, Hamamatsu, Japan

[73] Assignee: Hamamatsu Photonics K.K., Shizuoka, Japan

[21] Appl. No.: 974,514

[22] Filed: Nov. 12, 1992

[51] Int. Cl.⁵ .......................................... H01J 37/252
[52] U.S. Cl. ................................... 250/306; 250/305
[58] Field of Search ................................ 250/305, 306

[56] References Cited

U.S. PATENT DOCUMENTS 5,099,117  3/1992  Frohn et al. .................... 250/306
5,164,594  11/1992 Thompson et al. ............. 250/396 R

FOREIGN PATENT DOCUMENTS 1-19663  1/1989  Japan ................................ 250/305

Primary Examiner—Jack I. Berman
Attorney, Agent, or Firm—Sughrue, Mion, Zinn, Macpeak & Seas

[57] ABSTRACT

An electron detection apparatus detects information contained in electrons emitted from a sample. For the detection of electron, the apparatus uses a probe disposed in close proximity to the sample. The probe has a first side and a second side between which penetrates an aperture, wherein the first side of the probe confronts the sample. A voltage is applied between the probe and the sample. The voltage applied therebetween is set to a such a level that an electric field effect yields on the surface of the sample. Under the electric field effect yielding on the surface of the sample, light or heat is applied to the surface of the sample to emit the electrons from the sample. The electrons thus emitted is detected by entering electrons into the aperture at the first side, passing through the aperture and exiting from the aperture at the second side.

22 Claims, 7 Drawing Sheets

APPARATUS FOR DETECTING INFORMATION CONTAINED IN ELECTRONS EMITTED FROM SAMPLE SURFACE

BACKGROUND OF THE INVENTION

1. Field of the Invention

The present invention relates to an electron detection apparatus for detecting information contained in electrons emitted from a sample surface. More particularly, the invention relates to such an apparatus using a structure of a scanning tunnel microscope having a probe with an aperture.

2. Description of the Prior Art

ESCA (Electron Spectroscopy for Chemical Analysis) or XPS (X-ray Photoelectron Spectroscopy) has been used for surface analysis. In ESCA, while irradiating X-rays onto a sample, a minute area on the sample surface is subjected to sampling with an aperture or a slit of a small size. The minimum area detectable with the aperture or the slit would be 30 microns square at the most. If it is contemplated to further reduce the size of the detecting area, high intensity X-rays need to be irradiated onto the sample, which however can destroy the sample.

SUMMARY OF THE INVENTION

It is an object of the present invention to provide a new apparatus for detecting information about and from electrons emitted from a sample surface, including the quantity of electrons.

Another object of the present invention is to provide an electron detecting apparatus which is capable of detecting electron quantities emitted in picosecond time frames.

Still another object of the present invention is to provide an electron detecting apparatus which provides a good signal-to-noise ratio even when few electrons are emitted from the sample surface.

Further object of the present invention is to provide an electron detecting apparatus with which a spatial image with high spatial resolution can be obtained even when the sample surface is measured while being irradiated with light rays or heated.

To achieve the above and other objects, there is provided an electron detection apparatus for detecting information contained in electrons emitted from a sample. The apparatus includes a probe disposed in close proximity to the sample. The probe has a first side and a second side between which penetrates an aperture. The first side of the probe confronts the sample. There is provided means for applying a voltage between the probe and the sample. The voltage applied therebetween is set to a such a level that an electric field effect yields on the surface of the sample. There is further provided means for causing electrons to emit from the sample under the application of the voltage between the probe and the sample by the voltage applying means, such as means for applying light or heat to the sample. Electron detecting means is disposed to confront the second side of the probe for detecting the electrons being emitted from the sample, entering the aperture at the first side, passing through the aperture and exiting from the aperture at the second side.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENTS

Figure 1:
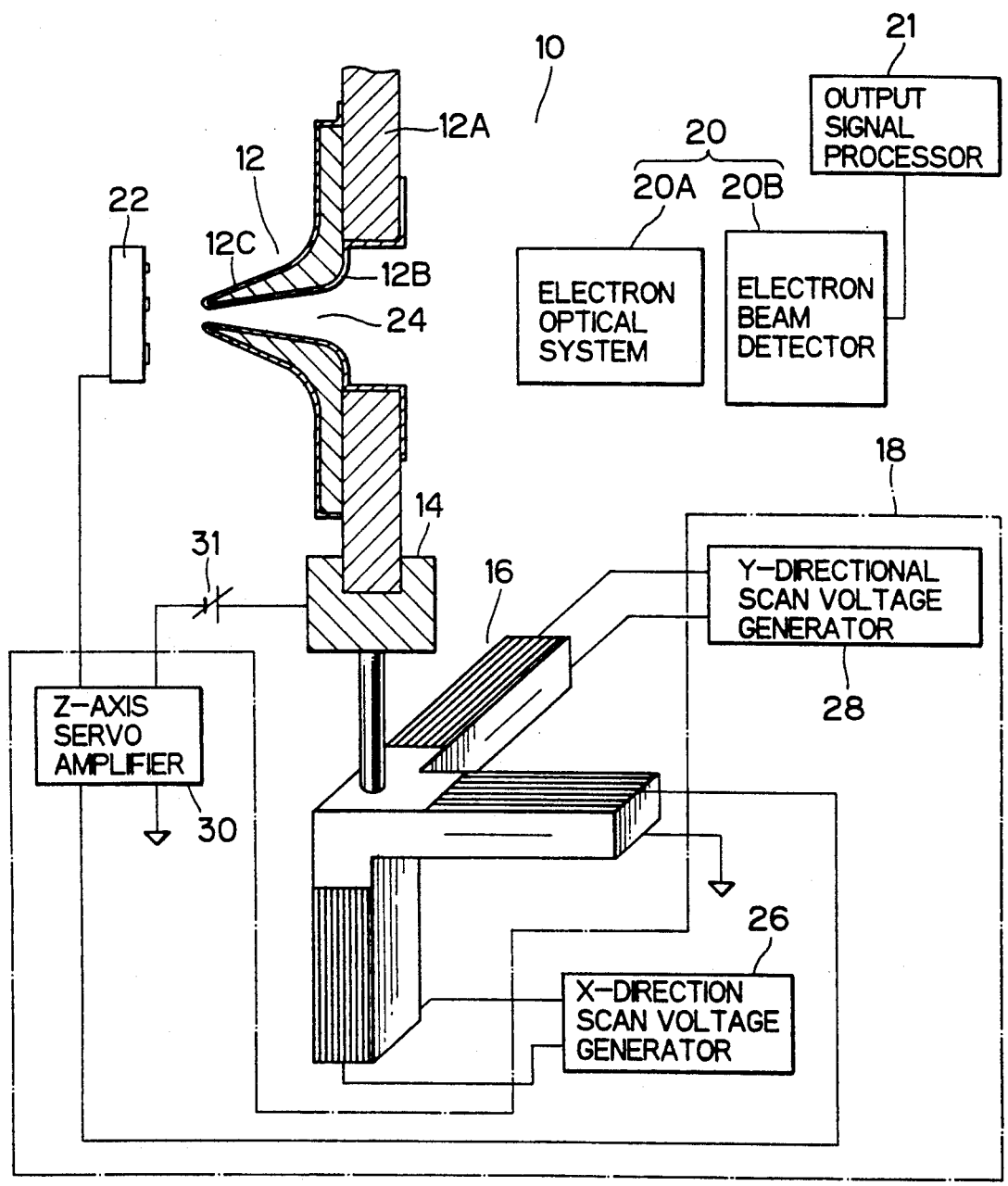
FIG. 1 is a cross-sectional diagram, partially illustrated in block form, showing an electron detecting apparatus according to an embodiment of the present invention.

Referring to the accompanying drawings, the following text will describe in detail preferred embodiments of the invention wherein like parts and components are designated by the same reference numerals to avoid duplicating description.

FIG. 1 is a schematic view showing an electron detection apparatus whose structure is similar to a scanning tunnel microscope (STM).

Before describing the structure of the embodiment of the invention, STMs will be briefly described. STMs have a very sharp acicular probe having an end of atomic dimensions which scans in a raster pattern over a sample surface. A small potential difference is established between the probe and the sample surface and a drive including a servo loop moves the probe towards and away from the surface. When the probe and the sample surface are in close proximity, electrons tunnel through the space between the surface and the probe, producing a small tunneling current. The drive under the control of the servo loop moves the probe toward and away from the sample surface to keep this tunnelling current constant. A signal taken from the servo loop determines features of the surface as the probe moves over it. This signal, after subsequent processing, provides a picture of the surface to be investigated. However, STM is only able to measure the magnitude of the tunnel current, that is, the amount of electrons, but unable to measure any of the other useful information possessed by electrons emitted from the sample surface. The information encompasses the electric potential of the sample surface, the distribution of initial speeds of electrons when emitted, i.e., distributions of both electron emission angles from the sample surface and magnitude of speed of each electron, and spin of the electrons. An additional problem exists which is brought about by ultra-fast (picosecond) changes of the amount of electrons emitted from the sample surfaces. Although electrons emitted from the sample surface change in picoseconds, a picosecond frequency response curve is not available due to limitations in frequency characteristic of amplifying circuits. A further problem has been observed in that noise from detectors and amplifiers can drown out signals produced when only a few electrons, such as ten or less, are emitted from the sample surface, thus prohibiting their accurate detection.

Referring now to FIG. 1, a probe 12 of a first embodiment of the invention is formed with an aperture 24 which extends from one end (hereinafter referred to as "tip end") facing the sample 22 to another end (hereinafter referred to as "output side") facing the electron beam detecting unit 20. In this embodiment, into the $SiO_2$ film 12B is formed by etching techniques the aperture 24 that penetrates from the tip end to the output side. Onto the surface of the SiO, film 12B and the inner surface of the aperture 24 is formed by gold-vapor deposition an approximately 100° thick gold film 12C.

As is shown in FIG. 1, the silicon substrate 12A, the $SiO_2$ film 12B, the aperture 24 and the gold film 12C form the probe 12. In this embodiment of the present invention, the outer diameter of the tip of the probe 12 is 0.2 microns, the length of the aperture 24 is 2 microns and the inner diameter of the aperture 24 is 0.1 microns at the tip and 1 micron at the output side.

Application of a bias voltage between a sample 22 and the probe 12 by a power source 31 establishes a small potential difference between the probe 12 and the sample 22. The probe 12 scans over the surface of the sample 22 while close enough to produce a small tunnelling current. A distance between the sample surface and the probe 12, that is, the Z-axis distance, is adjusted by a piezoelectric jogging scan element 16 to release an appropriate amount of tunnel current from the sample surface.

The piezoelectric jogging scan element 16 which is driven by a drive circuit 18 jogs a probe support 14 in X-, Y-, and Z-axial directions. The drive circuit 18 includes an X-direction scan voltage generator 26 for driving the piezoelectric jogging scan element 16 in the X-axial direction, an Y-direction scan voltage generator 28 for driving the piezoelectric jogging scan element 16 in the Y-axial direction, and a Z-axis servo amplifier 30 for driving the piezoelectric jogging scan element 16 in the Z-axial direction, that is, the distance between the tip of the probe 12 and the surface of the sample 22. The Z-axis servo amplifier 30 in the present invention is the same as used in conventional STMs. The Z-axis servo amplifier 30 moves the piezoelectric jogging scan element 16 in the Z-direction to adjust the distance between the tip of the probe 12 and the surface of the sample 22 based on a detected tunneling current.

The electron beam detecting unit 20 includes an electron optical system 20A and an electron beam detector 20B which detects the electrons multiplied or otherwise processed by the electron optical system 20A and which connects to an output signal processor 21.

Figure 2:
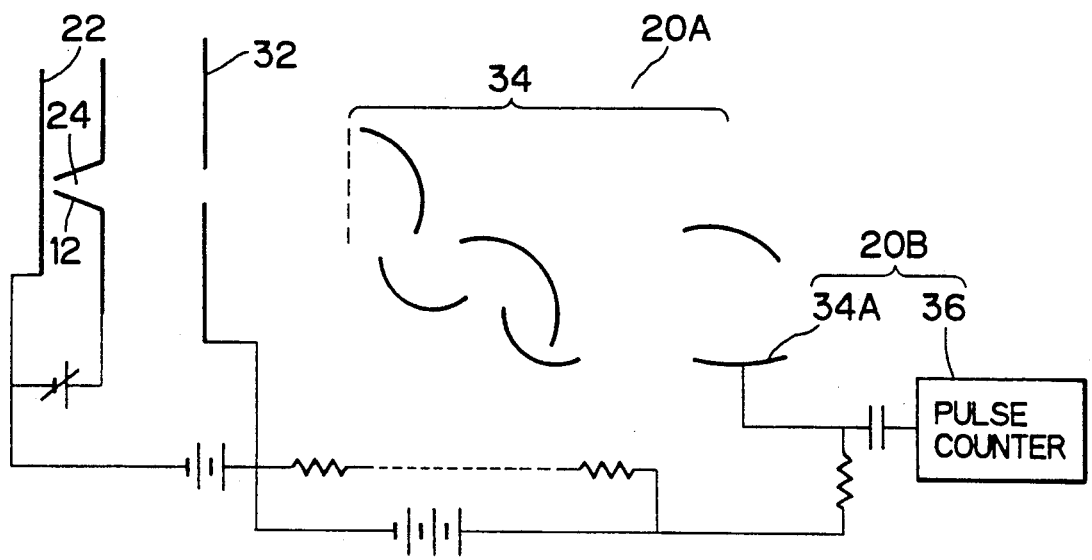
FIG. 2 is an enlarged schematic diagram showing an electron optical system of the apparatus shown in FIG. 1.

FIG. 2 is an enlargement of a section of FIG. 1 showing the electron optical system 20A. The electron optical system 20A includes an accelerating electrode 32 formed with an aperture at its axial center which aligns with the axial center of the aperture 24, and an electron multiplier 34 having an anode 34A for receiving electrons that emerge from the accelerating electrode 32. The electron beam detector 20B is made up of the anode 34A of the electron multiplier 34 and a pulse counter 36. The pulse counter 36 counts the total number of pulses produced for electrons received by the anode 34A.

If the tip of the probe 12 is moved to, for example, 500Å from the surface of the sample 22 and a voltage of a few volts is applied between the probe 12 and the sample 22, electrons are emitted from the sample 22 according to field emission effect and will enter and pass through the aperture 24. The accelerating electrode 32 accelerates electrons that emerge from the aperture 24 by applying to them a voltage of, for example, a few hundred volts. Electrons that emerge from the accelerating electrode 32 enter into the electron multiplier 34 where the number of electrons are multiplied. These electrons then enter the anode 34A where a pulse is generated for each electron. The pulse counter 36 counts the total number of pulses.

Consequently, this embodiment can detect even a very small initial current emitted from the surface of the sample 22. Moreover, if the piezoelectric jogging scan element 16 directs the scanning action of the tip of the probe 12 over the surface of the sample 22 in the X- and Y-axial directions, a spatial distribution of the emitted current can be obtained at a spatial resolution that is nearly equal to the 0.1 micron inner diameter of the tip of the aperture 24.

Although the aperture 24 above described was formed in the $SiO_2$ film 12B by etching techniques, it will be apparent to those skilled in the art that the present invention does not limit formation of the aperture 24 to this method. For example, another practical method involves softening a glass tube by heating, then stretching the tube into a tubular acicular shape. An aperture is formed either by etching the glass when it is well-suited for etching, or by cladding glass when it is not. The inner surface of the aperture is then coated with a metal film using vapor deposition techniques.

Figure 3:
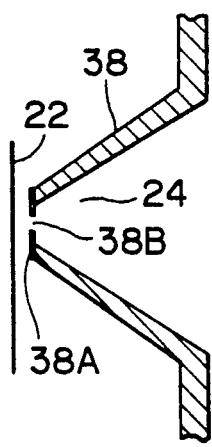
FIG. 3 is a cross-sectional view showing a modified probe according to the present invention.

FIG. 3 is a cross-sectional diagram showing another example of a probe 38 whose tip tapers less sharply than the probes mentioned in the previous paragraph, and whose aperture at the tip has an inner diameter of 0.2 microns. Onto the tip is formed by metal vapor deposition an approximately 500Å thick film 38A into which is formed an aperture 38B of approximately 500Å diameter. An approximately 100Å thick metal film can optionally be formed over the surface of the film 38A by vapor deposition. An aperture made as shown in FIG. 3 creates a more uniform electric field between the tip of the probe 38 and the surface of the sample 22 and moreover allows attaining of a higher resolution.

Another method of forming film 38A is by applying an organic film to the opening at the tip of the probe 38 and depositing by vapor deposition an approximately 100Å thick aluminum film to the surface of the organic film. The organic film is then removed by heating. Over the surface of the aluminum film is formed a resist film. The resist film is exposed to an electron beam to etch the resist film and form an approximately 50Å hole therein.

Figure 4A:
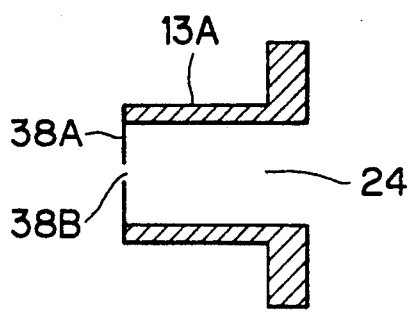
FIGS. 4A and 4B are cross-sectional views showing possible variations for the shape of the probe.
Figure 4B:
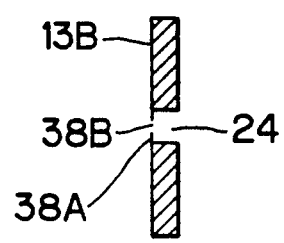

Although the examples of how to form an aperture have dealt only with probes 38 that taper to a tip, it will be apparent to those skilled in the art that this is not a limitation of the present invention. FIGS. 4A and 4B are cross-sectional diagrams showing possible variations for the shape of the probe 38. FIG. 4A is a cross-sectional diagram showing a pipe-shaped probe 13A whose tip is covered by a film 38A wherein a hole 38B is formed. FIG. 4B is a cross-sectional diagram showing a plate-shaped probe 13B with an aperture covered by a film 38A wherein a hole 38B is formed.

Figure 5:
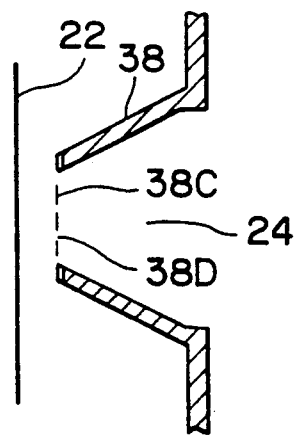
FIG. 5 is a cross-sectional view showing another possible shape for the tip of the probe.

FIG. 5 is a cross-sectional diagram showing another possible shape for the tip of the probe 38 whose tip is covered with a thin gold film 38C into which a plurality of holes 38D are formed for making the electric field between the sample 22 and the probe 12 more uniform while also allowing a large current to flow through the holes 38D.

Although the examples described so far have dealt with a sample 22 that is stationary and a probe 12 that is moved by the piezoelectric jogging scan element 16, this should not be considered a limitation of the present invention. The probe 12 can be stationary and the sample 22 moved by the piezoelectric jogging scan element 16.

The following text will describe variations in the preferred embodiment of the electron beam detecting unit 20 arranged at the output side of probes 12, 13A, and 13B.

Figure 6:
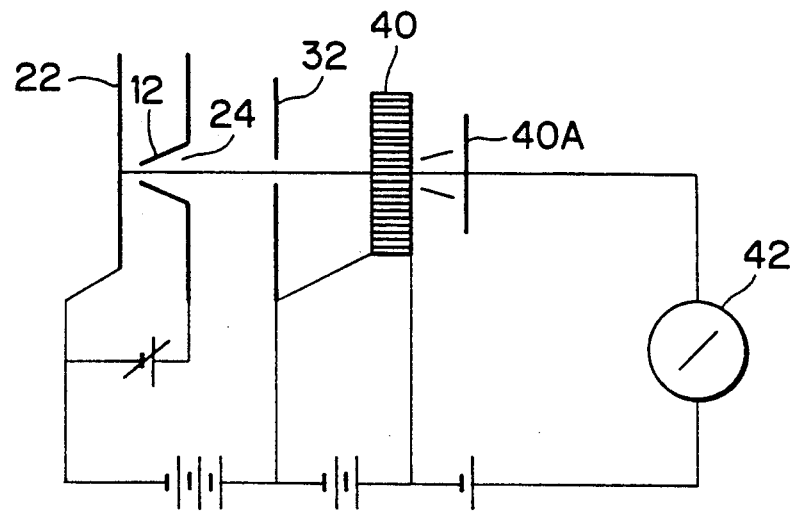
FIG. 6 is a diagram showing a variation of the preferred embodiment wherein to an accelerating electrode is added a microchannel plate for use as an electron multiplier.

FIG. 6 is a schematic diagram showing a variation of the preferred embodiment wherein to the accelerating electrode 32 is added a microchannel plate 40 for use as an electron multiplier 34. Electrons whose numbers have been multiplied in the microchannel plate 40 enter the anode 40A that is connected to an ammeter 42, or, as is shown in FIG. 2, to a pulse counter 36, for measuring output.

Groups of electrons can be emitted simultaneously from the sample 22 and the number of electrons making up of the groups can vary with time. The distribution of the variation can be determined by inputting the pulse from the anode 40A into a pulse height analyzer (not shown).

Figure 7:
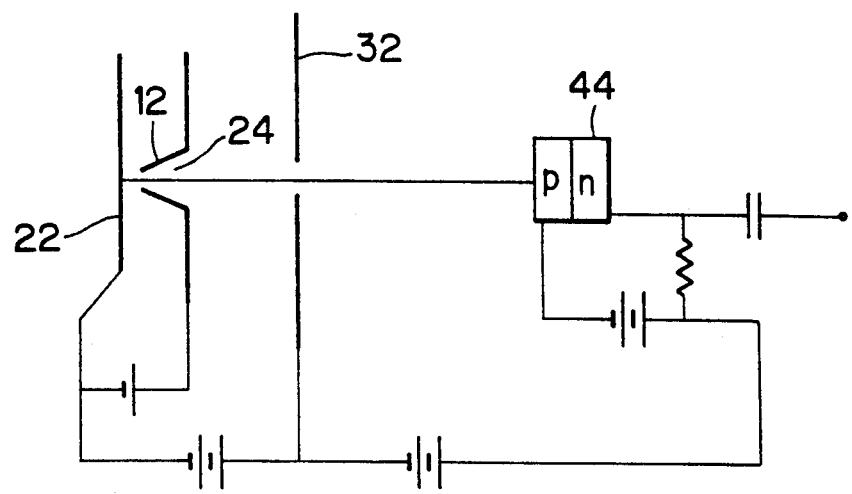
FIG. 7 is a circuit diagram showing another variation of the preferred embodiment wherein an electron injection semiconductor is added.

FIG. 7 is a schematic diagram showing a variation of the preferred embodiment wherein an electron injection semiconductor 44, which is a reverse-biased pn junction, is added. Electrons that are accelerated about 10 kV by the accelerating electrode 32 are injected into the electron injection semiconductor 44 thereby generating many electron-hole pairs. The resulting increased signal is obtained as the output pulse.

Figure 8:
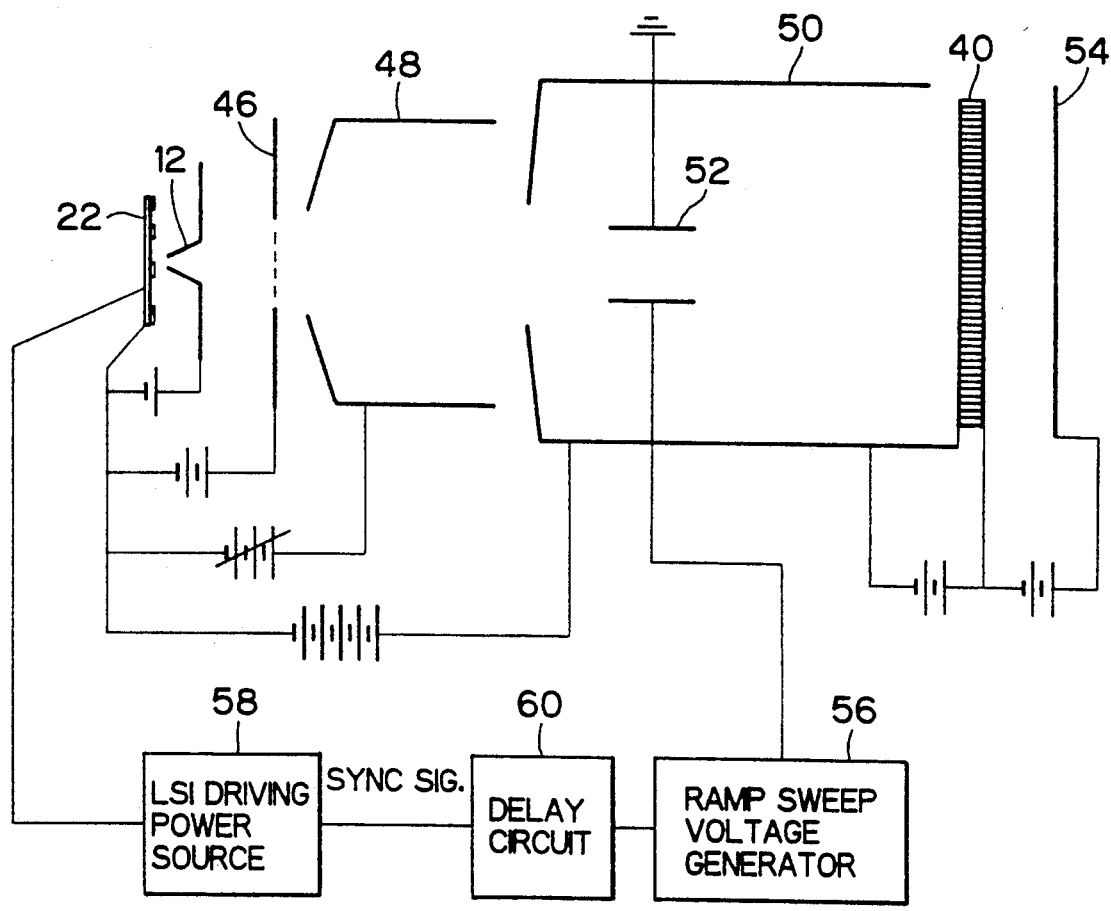
FIG. 8 is a cross-sectional diagram, partially illustrated in block form, showing another embodiment of the present invention.

FIG. 8 is a schematic diagram showing a variation of the preferred embodiment for detecting and measuring picosecond changes of electrons that are emitted from the surface of the sample 22. When the sample 22 is a large-scale integrated (LSI) circuit, this variation can temporally determine picosecond voltage changes that occur in a section of the LSI circuit that occur while the LSI circuit is being driven. In this variation of the preferred embodiment, the electron beam detecting unit 20 arranged on the output side of the probe 12 includes a mesh accelerating electrode 46, a focusing electrode 48, an anode 50, a deflecting electrode 52, a microchannel plate 40 and a fluorescent screen 54 which are arranged in the stated order. To the deflecting electrode 52 is applied a sweep voltage from a ramp sweep voltage generator 56 to which is input a synchronizing signal pulse from an LSI driving power source 58 by way of a delay circuit 60.

The electron beam emitted from the surface of the sample 22 is accelerated by the mesh accelerating electrode 46 and upon emerging from the electrode 46 focused by the focusing electrode 48 so that it passes through the deflecting electrode 52. The ramp sweep voltage from the generator 56 is applied to the deflecting electrode 52 in synchronization with the driving of the LSI driving power source 58 so that electrons are deflected by the deflecting electrode 52 in accordance with the sweep voltage. As a result, picosecond changes in electron voltage are translated into a luminance distribution on the fluorescent screen 54. Therefore, given a relationship between the tunnel current and the voltage between the sample 22 and the probe 12, the luminance distribution observed on the florescent screen 54 can be used to determine picosecond voltage changes on the area of the surface of the sample 22 being investigated. If the electron flow is large enough, the microchannel plate 40 is unnecessary. Also an electron injection CCD (charge-coupled device) can be used instead of the fluorescent screen 54. By obtaining changes in wave form of voltages in a succession of areas, the distribution of voltage and changes in the voltage of the total surface of the sample 22 can be determined.

The electron beam detector 20 in the variation of the preferred embodiment shown in FIG. 8 is equivalent to an electron lens system and electron beam detector device of a streak tube. However, an electron optical system used in a sampling streak tube can be used instead of the above electron beam detector 20. In this case, using an aperture electrode disposed in the front stage of the electron beam detector device, of the total electron beam sweep that emerges from the deflecting electrode 52, only an electron beam that occurs at a particular time instant can be selectively taken out at an output by way of illumination of the fluorescent screen 54. The illumination of the fluorescent screen 54 is then detected with a photomultiplier tube.

The total voltage wave form can be obtained by slightly delaying the sweeping time in relation to the driving of the LSI circuit. This method can also be used with the variations of the preferred embodiment shown in FIGS. 5 through 7 to obtain the total pulse voltage waveform by detecting pulses generated at the output side of the aperture and the time difference between the sweep and the LSI circuit driving.

Figure 9:
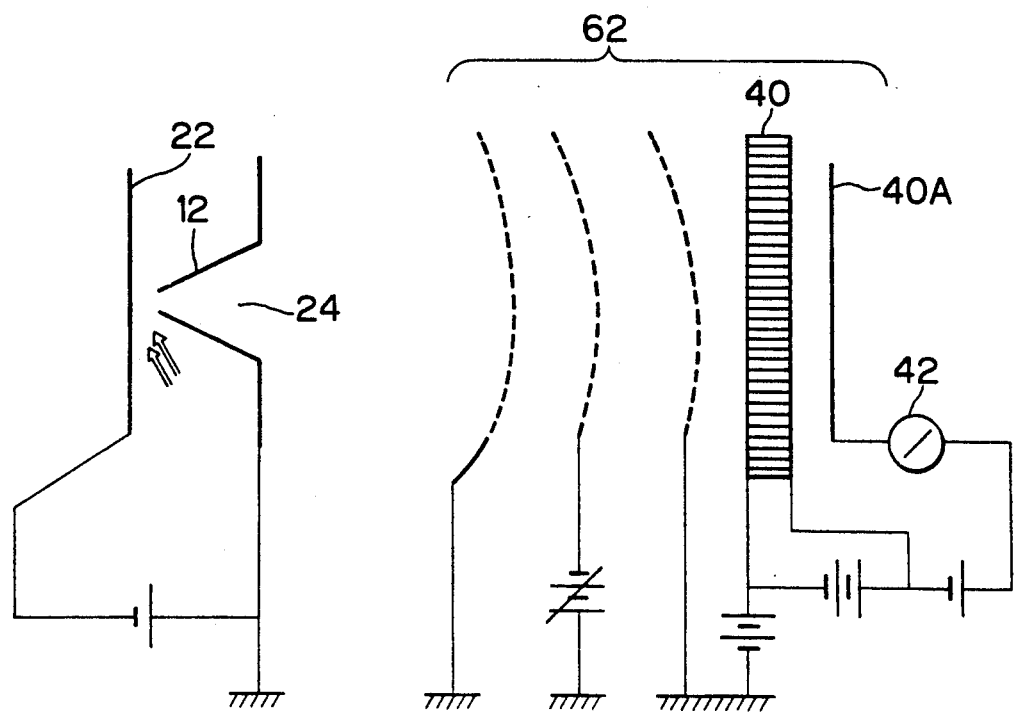
FIGS. 9 and 10 are cross-sectional diagrams showing further embodiments of electron beam detector.

FIG. 9 is a schematic diagram showing a variation of the preferred embodiment. In this variation, a voltage applied between the sample 22 and the probe 12 is increased to a level immediately before a field emission current is produced or a level in which the field emission current produced remains extremely small. In this condition, it has been discovered that a larger amount of photoelectrons, as compared with the measurement by the ESCA technique, emerge from the sample 22 into vacuum space. This is because work function of the sample material is greatly reduced resulting from electric field developed at the surface of the sample. Of the stream of photoelectrons emerged from the surface of the sample 22, only those that pass through aperture 24 of probe 12 enter an electron optical system 62 which includes an microchannel plate 40 and an anode 40A. Electron spectroscopy is performed in the electron optical system 62 to measure the energy distribution of the photoelectrons. While in the embodiment shown in FIG. 9, photoelectrons emerge from the sample 22 owing to the combination of electric field effect and application of light onto the sample, heat may be applied to the sample instead of light to achieve the same result.

Figure 10:
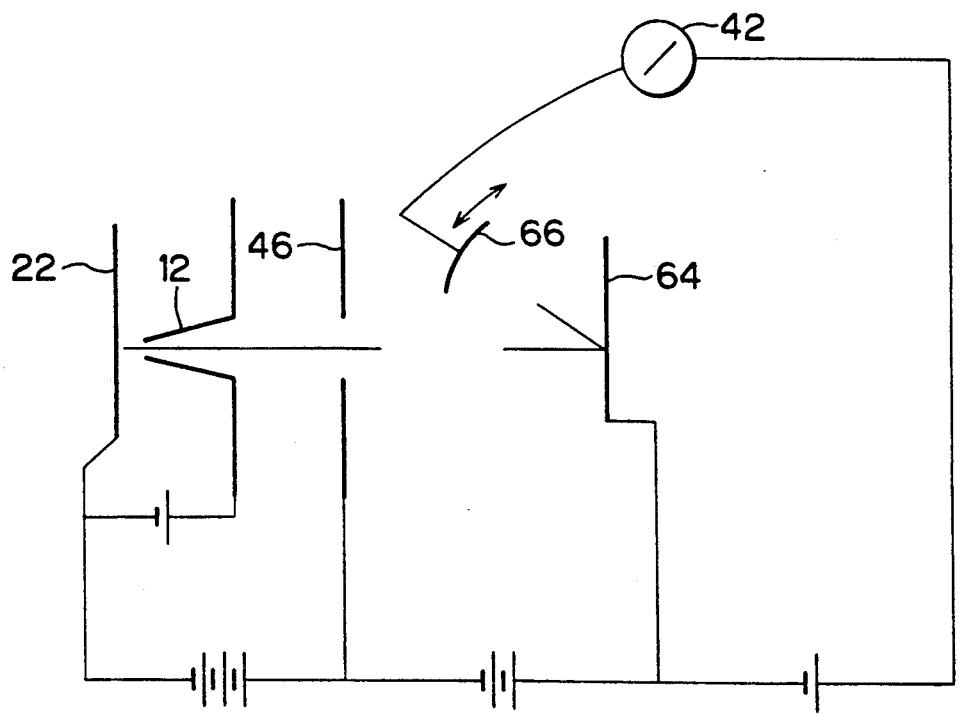

FIG. 10 is a schematic diagram showing a variation of the preferred embodiment wherein electrons emitted from the surface of the sample 22 that passed through the probe 12 are accelerated by the accelerating electrode 46, and impinge against a metal film 64. The angle of distribution at which the electrons reflect off the metal film 64 is determined at an angular position variable anode 66 whereupon the spin direction of the electrons can be determined.

Figure 11:
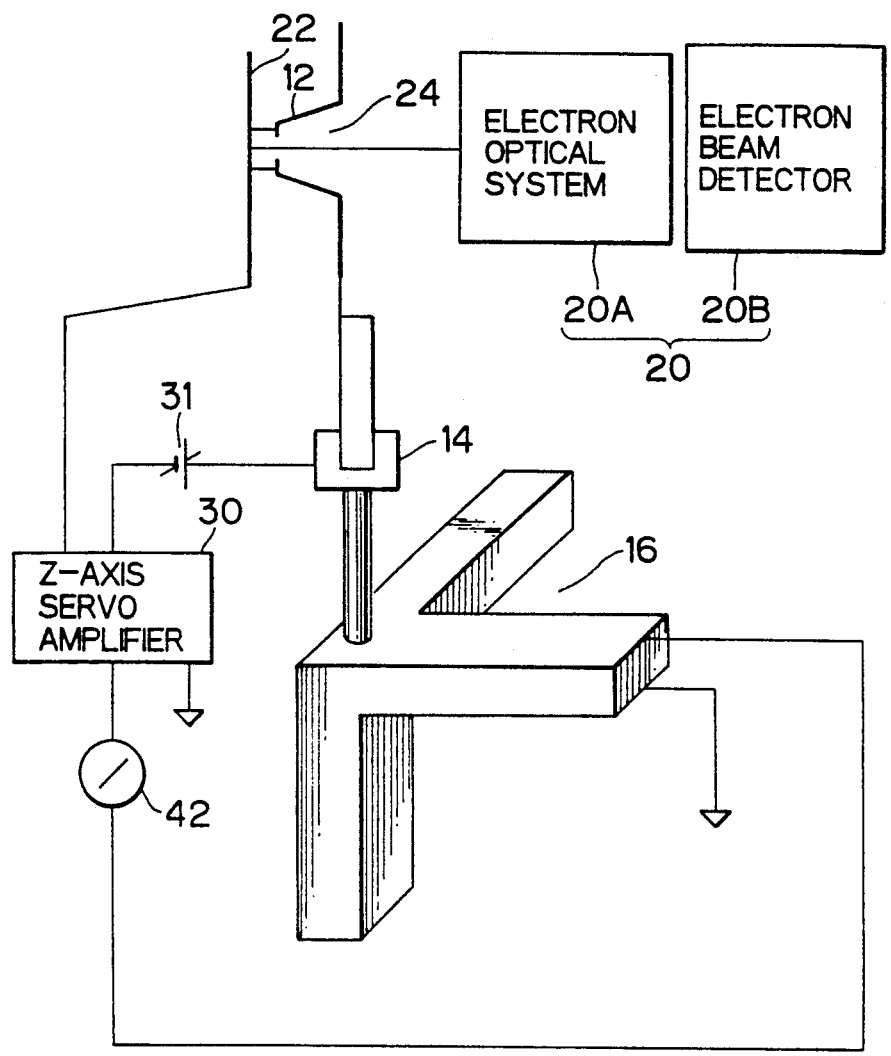
FIG. 11 is a cross-sectional diagram showing still another embodiment of the present invention.

FIG. 11 is a schematic diagram showing a variation of the preferred embodiment wherein of the tunnel current from the area of the surface of the sample 22 to be measured, only that which enters sections of the tip other than the aperture 24 is measured. The probe 12 is jogged in the z-axial direction in accordance with the measured tunnel current.

Figure 12:
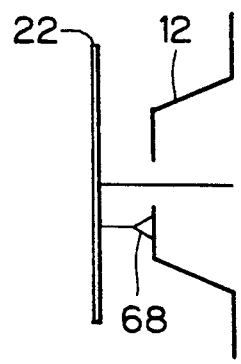
FIG. 12 is a cross-sectional view showing another variation for the shape of the probe.

FIG. 12 is a cross-sectional diagram showing a variation of the preferred embodiment wherein an acicular electrode 68 is attached to the tip of probe 12 at a position very near the aperture 24. Jogging of the probe 12 in the Z-axial direction is performed in accordance with the tunnel current that flows into the electrode 68.

While the invention has been described in detail with reference to specific embodiments thereof, it would be apparent to those skilled in the art that various changes and modifications may be made therein without departing from the spirit of the invention. For example, in the foregoing description, the voltage applied to the probe, that is positive in polarity, is higher than the voltage on the sample, that is negative in polarity, so as to yield a field emission current from the sample. As a modification, the polarities of the voltage applied between the probe and the sample may be reversed to yield a stream of ions from the sample by field ionization or field evaporation.

What is claimed is:

1. A scanning probe electron detection apparatus for detecting information contained in electrons emitted from a sample, the sample having a surface, comprising:
    a probe disposed in close proximity to the sample and having a first side and a second side between which penetrates an aperture, the first side confronting the sample;
    means for applying a voltage between said probe and the sample, the voltage being set to a such a level that an electric field effect yields on the surface of the sample;
    means for causing electrons to be emitted from the sample under the application of the voltage between said probe and the sample by said voltage applying means; and
    electron detecting means disposed to confront the second side of said probe for detecting the electrons being emitted from the sample, entering the aperture at the first side, passing through the aperture and exiting from the aperture at the second side.

2. The apparatus according to claim 1, wherein said means for causing electrons to be emitted from the sample comprises means for applying light onto the sample.

3. The apparatus according to claim 1, wherein said means for causing electrons to be emitted from the sample comprises means for applying heat to the sample.

4. The apparatus according to claim 1, wherein said probe is an acicular shape with the first and second sides axially aligned.

5. The apparatus according to claim 1, wherein said probe has a film formed at the first side of said probe in perpendicular to the aperture, at least one opening being formed in said film to allow the electrons emitted from the sample to enter the aperture.

6. The apparatus according to claim 5, wherein said probe is an acicular shape with the first and second sides axially aligned.

7. The apparatus according to claim 5, wherein said probe is a cylindrical shape with the first and second sides axially aligned.

8. The apparatus according to claim 5, wherein said probe is a flat-plate shape defined by first and second flat sides.

9. The apparatus according to claim 1, further comprising jogging means for moving said probe relative to the surface of the sample.

10. The apparatus according to claim 9, further comprising control means connected to said jogging means for controlling a distance of said probe from the surface of the sample.

11. The apparatus according to claim 10, wherein said control means controls the distance of said probe from the surface of the sample according to a current flowing from the sample to said probe.

12. The apparatus according to claim 1, wherein said electron detection means includes an electron accelerator and an electron multiplier.

13. The apparatus according to claim 1, wherein the electron detection means includes an electron accelerator, a microchannel plate, and an anode.

14. The apparatus according to claim 1, wherein said electron detection means includes an electron accelerator, and an electron injection semiconductor.

15. The apparatus according to claim 1, wherein said electron detection means includes an electron accelerator, a focusing electrode, a deflecting electrode, and an electron detection section having position resolution means for converting information measured in electrons into a spatial distribution and displaying the spatial distribution.

16. The apparatus according to claim 15, wherein said position resolution means is a fluorescent screen.

17. The apparatus according to claim 16, wherein said position resolution means is an electron injection charge-coupled device.

18. The apparatus according to claim 1, wherein said electron detection means includes an electron accelerator, a focusing electrode, a deflecting electrode, and an aperture electrode for separating electrons emitted at a preselected point in time from an electron beam introduced into said electron detection means.

19. The apparatus according to claim 1, wherein said electron detection means includes an electron optical system for capturing and performing spectroscopy on the electrons introduced into said electron detection means.

20. The apparatus according to claim 19, wherein said electron optical system includes a microchannel plate, and an anode.

21. The apparatus according to claim 1, wherein said electron detection means includes an electron optical system for detecting spin of electrons emerged from the aperture.

22. The apparatus according to claim 21, wherein said electron optics system includes an accelerating electrode, a metal film against which electrons accelerated by said accelerating electrode impinge, and an anode for collecting the electrons.

* * * * *